United States Patent
Chen et al.

(10) Patent No.: US 11,955,425 B2
(45) Date of Patent: Apr. 9, 2024

(54) INTERCONNECT STRUCTURE FOR LOGIC CIRCUIT

(71) Applicant: Taiwan Semiconductor Manufacturing Co., Ltd., Hsin-Chu (TW)

(72) Inventors: Fang Chen, Hsinchu (TW); Jhon Jhy Liaw, Hsinchu County (TW); Min-Chang Liang, Hsin-Chu County (TW)

(73) Assignee: TAIWAN SEMICONDUCOTR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/168,043

(22) Filed: Feb. 13, 2023

(65) Prior Publication Data

US 2023/0197605 A1    Jun. 22, 2023

Related U.S. Application Data

(60) Continuation of application No. 16/696,824, filed on Nov. 26, 2019, now Pat. No. 11,581,256, which is a
(Continued)

(51) Int. Cl.
*H01L 23/522*     (2006.01)
*G06F 30/39*      (2020.01)
(Continued)

(52) U.S. Cl.
CPC .......... *H01L 23/5226* (2013.01); *G06F 30/39* (2020.01); *H01L 21/76838* (2013.01);
(Continued)

(58) Field of Classification Search
CPC ....... H01L 2027/11888; H01L 23/5221; H01L 23/5226; H01L 23/528; H01L 27/0207
See application file for complete search history.

(56) References Cited

U.S. PATENT DOCUMENTS 5,723,883 A    3/1998   Gheewalla
7,287,237 B2   10/2007  Morton
(Continued)

FOREIGN PATENT DOCUMENTS

DE    102006024654    2/2007
KR    20170045388     4/2017

OTHER PUBLICATIONS

Giggle Hardware "GPU process technology changed in 16/14nm FinFET generation", https://gigglehd.com/gg/hard/190948, 18 pages Aug. 8, 2016.

*Primary Examiner* — Raj R Gupta
(74) *Attorney, Agent, or Firm* — HAYNES AND BOONE, LLP

(57) ABSTRACT

Interconnect structures that maximize integrated circuit (IC) density and corresponding formation techniques are disclosed. An exemplary IC device includes a gate layer extending along a first direction. An interconnect structure disposed over the gate layer includes odd-numbered interconnect routing layers oriented along a second direction that is substantially perpendicular to the first direction and even-numbered interconnect routing layers oriented along a third direction that is substantially parallel to the first direction. In some implementations, a ratio of a gate pitch of the gate layer to a pitch of a first of the even-numbered interconnect routing layers to a pitch of a third of the even-numbered interconnect routing layers is 3:2:4. In some implementations, a pitch of a first of the odd-numbered interconnect routing layers to a pitch of a third of the odd-numbered interconnect routing layers to a pitch of a seventh of the odd-numbered interconnect routing layers is 1:1:2.

20 Claims, 6 Drawing Sheets

Related U.S. Application Data division of application No. 15/938,484, filed on Mar. 28, 2018, now Pat. No. 10,916,498.

(51) Int. Cl.
*H01L 21/768* (2006.01)
*H01L 23/528* (2006.01)

(52) U.S. Cl.
CPC .... *H01L 21/76897* (2013.01); *H01L 23/5221* (2013.01); *H01L 23/528* (2013.01)

(56) References Cited

U.S. PATENT DOCUMENTS

| | | |
|---|---|---|
| 8,779,592 B2 | 7/2014 | Tang et al. |
| 9,331,016 B2 | 5/2016 | Chen et al. |
| 9,496,173 B2 | 11/2016 | Fischer et al. |
| 9,543,193 B2 | 1/2017 | Lu et al. |
| 9,583,438 B2 | 2/2017 | Liaw et al. |
| 9,620,510 B2 | 4/2017 | Liaw |
| 9,653,563 B2 | 5/2017 | Liaw |
| 9,716,032 B2 | 7/2017 | Tang et al. |
| 9,972,571 B1 * | 5/2018 | Chen ................ H01L 21/76849 |
| 2004/0212023 A1 | 10/2004 | Umezawa et al. |
| 2009/0032967 A1 * | 2/2009 | Becker ................ H01L 27/0207 257/776 |
| 2014/0327050 A1 | 11/2014 | Hsieh et al. |
| 2015/0333008 A1 | 11/2015 | Gupta et al. |
| 2016/0181257 A1 | 6/2016 | Liaw |
| 2016/0211212 A1 | 7/2016 | Chao et al. |
| 2016/0329241 A1 | 11/2016 | Lin et al. |
| 2017/0077029 A1 | 3/2017 | Nelson et al. |
| 2017/0294448 A1 | 10/2017 | Debacker et al. |

\* cited by examiner

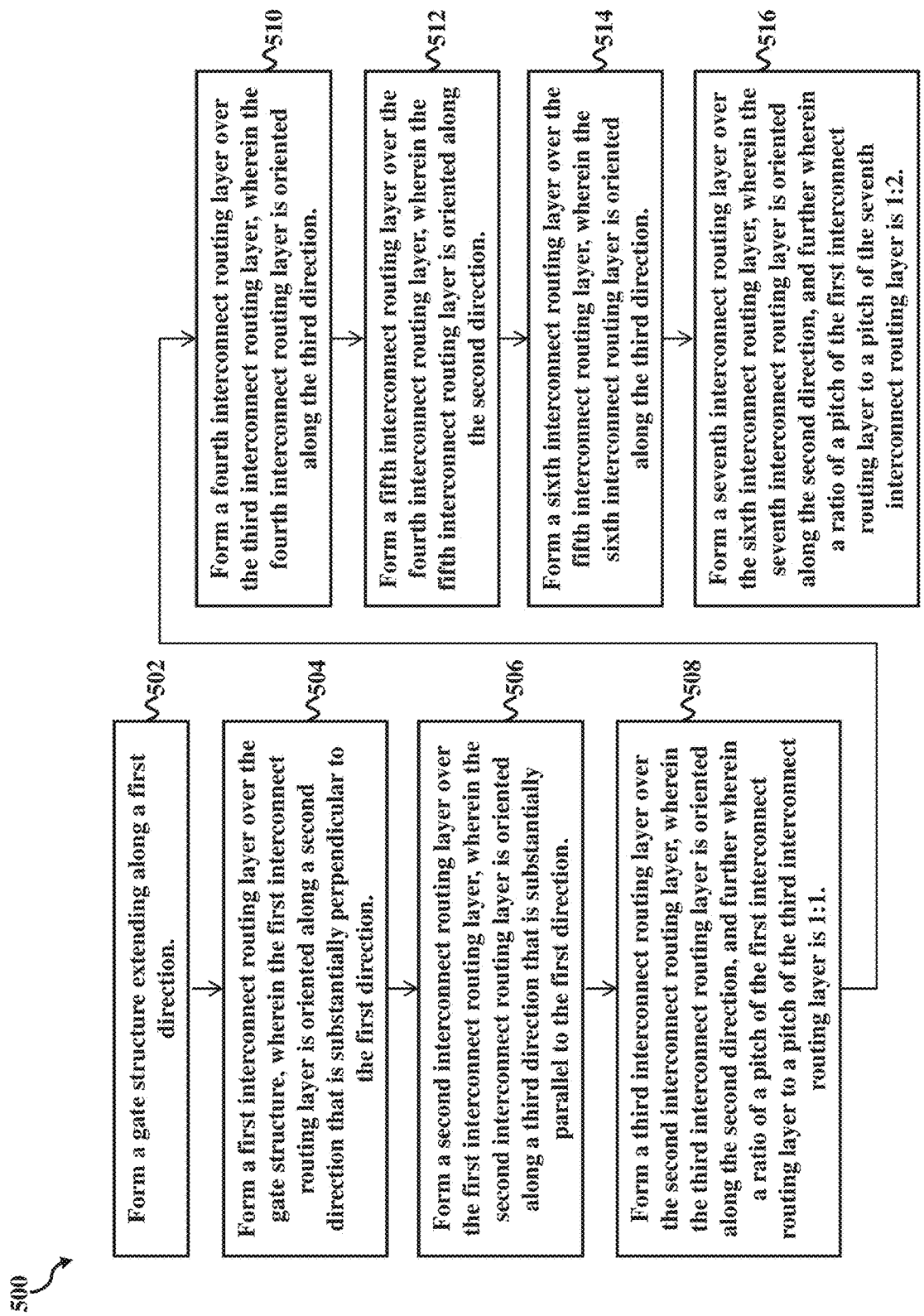

INTERCONNECT STRUCTURE FOR LOGIC CIRCUIT

This is a continuation application of U.S. patent application Ser. No. 16/696,824, filed Nov. 26, 2019, which is a divisional application of U.S. patent application Ser. No. 15/938,484, filed Mar. 28, 2018, now U.S. Pat. No. 10,916,498, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, an IC device typically includes an array of standard cells, each of which includes transistors and interconnect (or routing) structures that combine to provide a logic function (for example, AND, NAND, OR, NOR, NOT, XOR, and/or XNOR) and/or a storage function (for example, flip flop and/or latch). In IC devices with sub-micron feature sizes, challenges arise in configuring the transistors and interconnect structures relative to one another in a manner that maximizes logic density and routing efficiency. Accordingly, improvements to interconnect structures are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 is a flow chart of a method for fabricating an interconnect structure for an integrated circuit device, such as depicted in FIG. 2A and FIG. 2B, according to various aspects of the present disclosure.

DETAILED DESCRIPTION

Figure 1A:
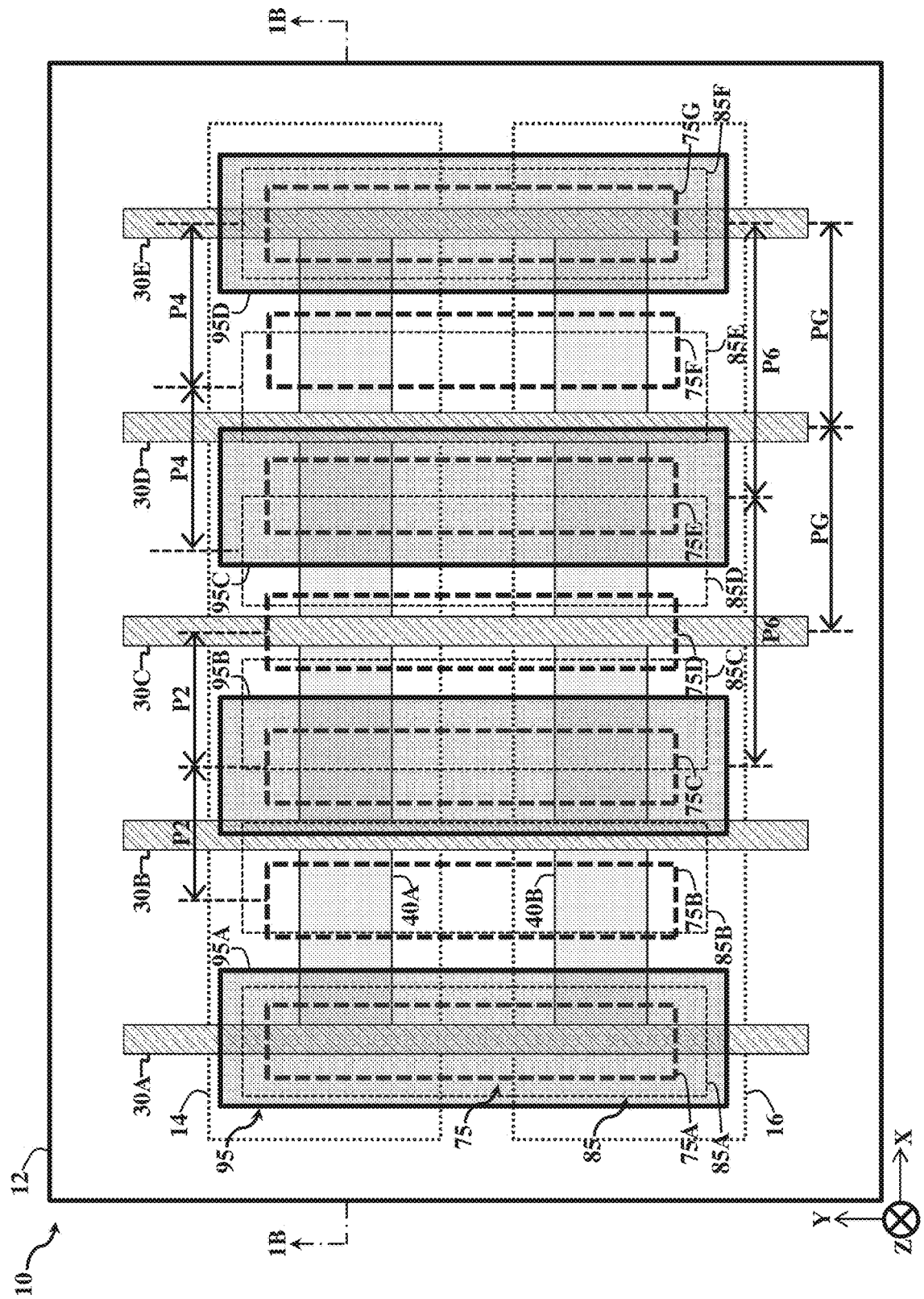
FIG. 1A is a simplified schematic top view of an integrated circuit device, in portion or entirety, having an improved interconnect structure that maximizes logic density according to various aspects of the present disclosure.

The present disclosure relates generally to integrated circuit devices, and more particularly, to interconnect structures for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Integrated circuit (IC) design defines various standard cells having predetermined functions. Each standard cell includes transistors and interconnect (or routing) structures that combine to provide a logic function (for example, AND, NAND, OR, NOR, NOT, XOR, and/or XNOR) and/or a storage function (for example, flip flop, latch, and/or buffer). Generating an IC design layout typically includes placing (or arranging) an array of standard cells in a given area to achieve a specific function and routing to connect the standard cells with each other. An IC device can then be fabricated using the IC design layout. As IC technologies progress towards smaller technology nodes, challenges arise in configuring the transistors and interconnect structures relative to one another in a manner that maximizes logic density and routing efficiency. For example, setting pitch on a layer by layer basis without considering pitch of other layers in an interconnect structure of the IC device and/or pitch of IC features of the IC device has led to inefficient use of IC area, which can negatively impact IC performance and unnecessarily increase an area needed for a given standard cell. The present disclosure thus proposes various interconnect structures (in particular, various pitch ratios for the interconnect structures) that enable IC devices to maintain high performance while achieving high density and high routing efficiency required for advanced technology nodes.

Figure 1B:
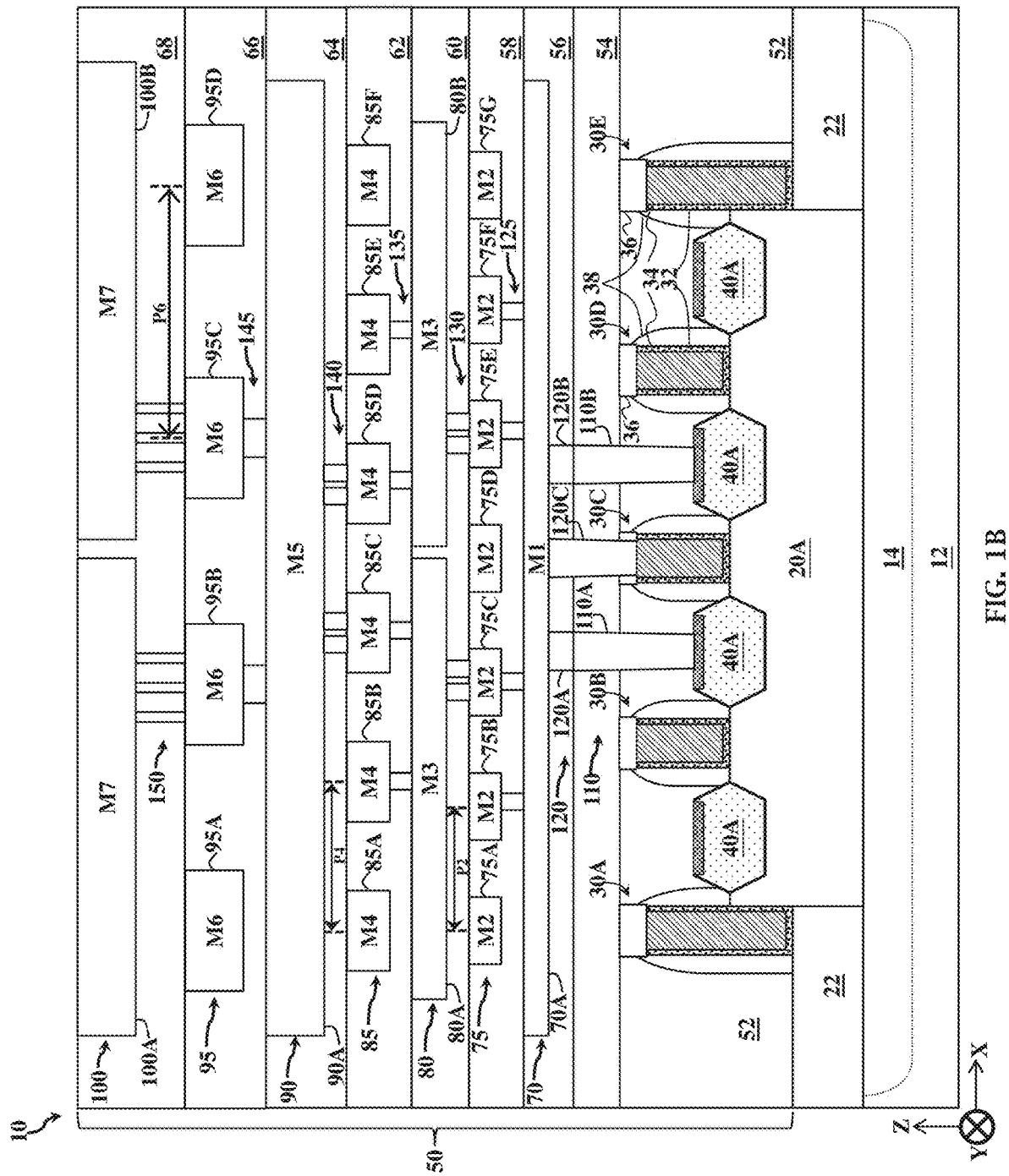
FIG. 1B is a diagrammatic cross-sectional view of the integrated circuit device of FIG. 1A along line 1B-1B according to various aspects of the present disclosure.

FIG. 1A and FIG. 1B are fragmentary diagrammatic views of an IC device 10, in portion or entirety, according to various aspects of the present disclosure. In particular, FIG.

1A is a simplified schematic top view of IC device 10 (for example, in an x-y plane), and FIG. 1B is a diagrammatic cross-sectional view of IC device 10 along line 1B-1B of FIG. 1A (for example, in an x-z plane). IC device 10 can be included in a microprocessor, a memory cell, and/or other IC device. In some implementations, IC device 10 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, fin-like FETs (FinFETs), high voltage transistors, high frequency transistors, other suitable components, or combinations thereof. In some implementations, IC device 10 is a portion of a standard cell of an IC chip that performs a logic function (for example, AND, NAND, OR, NOR, NOT, XOR, and/or XNOR) and/or a storage function (for example, flip flop and/or latch). The standard cell can alternatively be referred to as a logic cell and/or a storage cell depending on its functionality. For purposes of the present disclosure, IC device 10 is a portion of a logic circuit that can be included in a logic cell. FIG. 1A and FIG. 1B have been simplified for the sake of clarity to better understand the inventive concepts of the present disclosure. Additional features can be added in IC device 10, and some of the features described below can be replaced, modified, or eliminated in other embodiments of IC device 10.

IC device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen, wafer bonding, and/or other suitable methods. In some implementations, substrate 12 includes one or more group III-V materials. In some implementations, substrate 12 includes one or more group II-IV materials.

Substrate 12 includes various doped regions, such as a doped region 14 and a doped region 16, configured according to design requirements of IC device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. In some implementations, doped region 14 is configured for a p-type field effect transistor (PFET), such as a pull-up (PU) FinFET, and doped region 16 is configured for an n-type FET (NFET), such as a pull-down (PD) FinFET, such that IC device 10 includes a CMOS transistor. For example, doped region 14 is an n-type doped region, and doped region 16 is a p-type doped region. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions.

IC device 10 includes various fins (also referred to as active fin regions) disposed over substrate 12, such as fin 20A. In FIG. 1B, the PFET includes fin 20A, though the present disclosure contemplates embodiments where the PFET and/or the NFET include more fins (configured, for example, for multi-fin transistors). Fins of IC device 10, such as fin 20, are oriented substantially parallel to one another, each having a length defined in a x-direction, a width defined in an y-direction, and a height defined in a z-direction. Fins of IC device 10, such as fin 20A, each have a channel region, a source region, and a drain region defined along their length in the x-direction, where the channel region is disposed between the source region and the drain region (generally referred to as source/drain regions). The channel region includes a top portion defined between sidewall portions, where the top portion and the sidewall portions engage with a gate structure (as described below), such that current can flow between the source region and the drain region during operation of IC device 10. The source/drain regions also include top portions defined between sidewall portions. In some implementations, fins of IC device 10, such as fin 20A, are a portion of substrate 12 (such as a portion of a material layer of substrate 12). For example, where substrate 12 includes silicon, fin 20A includes silicon. Alternatively, in some implementations, fins of IC device 10, such as fin 20A, are defined in a material layer, such as one or more semiconductor material layers, overlying substrate 12. For example, fin 20A can include a semiconductor layer stack (also referred to as a heterostructure) having various semiconductor layers disposed over substrate 12. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of IC device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a and c are different atomic percentages of silicon and b and d are different atomic percentages of germanium).

Fins of IC device 10, such as fin 20A, are formed over substrate 12 using any suitable process. In some implementations, a combination of deposition, lithography and/or etching processes are performed to define fin 20A extending from substrate 12 as illustrated in FIG. 1B. For example, forming fin 20A includes performing a lithography process to form a patterned resist layer over substrate 12 (or a material layer, such as a heterostructure, disposed over substrate 12) and performing an etching process to transfer a pattern defined in the patterned resist layer to substrate 12 (or the material layer, such as the heterostructure, disposed over substrate 12). The lithography process can include forming a resist layer on substrate 12 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 12 (or a material layer disposed over substrate 12). The etching process can include a dry etching process (for example, a reactive ion etching (RIE) process), a wet etching process, other suitable etching process, or combinations thereof. After the etching process, the patterned resist layer is removed from substrate 12, for example, by a resist stripping process. Alternatively, fins of IC device 10, such as fin 20A, are formed by a multiple patterning process, such as a double patterning lithography (DPL) process (for example, a lithography-etch-lithography-etch (LELE) process, a self-aligned double patterning (SADP) process, a spacer-is-dielectric (SID) SIDP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fins of IC device 10, such as fin 20A. Further, in some implementations, the exposure process can implement maskless lithography, electron-beam (e-beam) writing, ion-beam writing, and/or nanoimprint technology for patterning the resist layer.

An isolation feature(s) 22 is formed over and/or in substrate 12 to isolate various regions, such as various device regions, of IC device 10. For example, isolation feature 22 separates and isolates active device regions and/or passive device regions from each other, such as the PFET and the NFET. Isolation feature 22 further separates and isolates fins of IC device 10 from one another, such as fin 20A from other fins of IC device 10. In the depicted embodiment, isolation feature 22 surrounds a bottom portion of fin 20A. Isolation feature 22 includes silicon oxide, silicon nitride, silicon oxynitride, other suitable isolation material (for example, including silicon, oxygen, nitrogen, carbon, or other suitable isolation constituent), or combinations thereof. Isolation feature 22 can include different structures, such as shallow trench isolation (STI) structures, deep trench isolation (DTI) structures, and/or local oxidation of silicon (LOCOS) structures. In some implementations, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 22. In some implementations, STI features can be formed by depositing an insulator material over substrate 12 after forming fins (in some implementations, such that the insulator material layer fills gaps (trenches) between fins) and etching back the insulator material layer to form isolation feature 22. In some implementations, isolation feature 22 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 22 includes a dielectric layer disposed over a doped liner layer (including, for example, boron silicate glass (BSG) or phosphosilicate glass (PSG)).

Various gate structures are disposed over fins of IC device 10, such as a gate structure 30A, a gate structure 30B, a gate structure 30C, a gate structure 30D, and a gate structure 30E. Gate structures 30A-30E extend along the y-direction (for example, substantially perpendicular to fins of IC device 10, such as fin 20A), such that each of gate structures 30A-30E have a length defined in the y-direction, a width defined in the x-direction, and a height defined in the z-direction. In the depicted embodiment, gate structures 30B-30D are disposed over the channel regions of fins of IC device 10, such as fin 20A. In some implementations, gate structures 30B-30D wrap the channel regions of fins of IC device 10, thereby interposing the source/drain regions of fins of IC device 10. Gate structures 30B-30D engage the channel regions of fins of IC device 10, such as fin 20A, such that current can flow between the source/drain regions of fins of IC device 10 during operation. In furtherance of the depicted embodiment, gate structures 30A-30E are configured as active gate structures or dummy gate structures depending on design requirements of IC device 10. "Active gate structure" generally refers to an electrically functional gate structure of IC device 10, whereas "dummy gate structure" generally refers to an electrically non-functional gate structure of IC device 10. In some implementations, a dummy gate structure mimics physical properties of an active gate structure, such as physical dimensions of the active gate structure, yet is inoperable (in other words, does not enable current to flow) in IC device 10. In some implementations, a dummy gate structure enables a substantially uniform processing environment, for example, enabling uniform epitaxial material growth in source/drain regions of IC device 10 (for example, when forming epitaxial source/drain features), uniform etch rates in source/drain regions of IC device 10 (for example, when forming source/drain recesses), and/or uniform, substantially planar surfaces (for example, by reducing (or preventing) CMP-induced dishing effects).

Gate structures 30A-30E include gate stacks configured to achieve desired functionality according to design requirements of IC device 10, such that gate structures 30A-30E include the same or different layers and/or materials. In the depicted embodiment, gate structures 30A-30E have gate stacks that include a gate dielectric 32, a gate electrode 34, and a hard mask layer 36. Gate dielectric 32 is conformally disposed over fins of IC device 10 and isolation feature 22, such that gate dielectric 32 has a substantially uniform thickness. In the depicted embodiment, gate dielectric 32 is disposed on sidewall surfaces and bottom surfaces of IC device 10 defining gate stacks of gate structures 30A-30E. Gate dielectric 32 includes a dielectric material, such as silicon oxide, high-k dielectric material, other suitable dielectric material, or combinations thereof. In the depicted embodiment, gate dielectric 32 includes a high-k dielectric material (and thus may be referred to as a high-k dielectric layer), such as hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). In some implementations, gate dielectric 32 further includes an interfacial layer (including a dielectric material, such as silicon oxide) disposed between the high-k dielectric layer and fins of IC device 10. Gate electrode 34 is disposed over gate dielectric 32. Gate electrode 34 includes an electrically conductive material. In some implementations, gate electrode 34 includes multiple layers, such as a capping layer, a work function layer, a glue/barrier layer, and a metal fill (or bulk) layer. The capping layer can include a material that prevents or eliminates diffusion and/or reaction of constituents between gate dielectric 32 and other layers of gate structures 30A-30E (in particular, gate layers including metal). In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. The work function layer can include a conductive material tuned to have a desired work function, such as an n-type work function material and/or a p-type work function material. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. The glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. The metal fill layer can include a suitable conductive material, such as Al, W, Cu, and/or Co. Gate dielectric 32 and/or gate electrode 34 may include numerous other layers, for example, capping layers, interface layers, diffusion layers, barrier layers, hard mask layers, or combinations thereof. Hard mask layer 36 includes any suitable material, such as silicon and nitrogen (for example, silicon nitride). In some implementations, since gate structures 30A-30E span the PFET and the NFET, gate structures 30A-30E may have different layers in regions corresponding with the PFET and the NFET.

Gate stacks of gate structures 30A-30E are fabricated according to a gate last process, a gate first process, or a hybrid gate last/gate first process. In gate last process implementations, one or more of gate structures 30A-30E include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 32 and/or gate electrode 34 are subsequently formed. In some implementations, a dummy gate stack of at least one of gate structures 30A-30E is replaced with a metal gate stack, while a dummy gate stack of at least one of gate structures 30A-30E remains. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

Gate structures 30A-30E further include respective gate spacers 38 disposed adjacent to (for example, along sidewalls of) the respective gate stacks. Gate spacers 38 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form gate spacers 38. In some implementations, gate spacers 38 include a multi-layer structure, such as a first dielectric layer that includes silicon nitride and a second dielectric layer that includes silicon oxide. In some implementations, gate spacers 38 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 12 and subsequently anisotropically etched to form a first spacer set adjacent to the gate stacks, and a second dielectric layer including silicon and nitrogen can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIG. 1A and FIG. 1B) in fins of IC device 10, such as fin 20A, before and/or after forming gate spacers 38.

Epitaxial source features and epitaxial drain features (referred to as epitaxial source/drain features) are disposed over the source/drain regions of IC device 10. For example, semiconductor material is epitaxially grown on the fins, forming epitaxial source/drain features 40A and epitaxial source/drain features 40B. In some implementations, epitaxial source/drain features 40A, 40B are formed over the source/drain regions of fins of IC device 10 after a fin recess process (for example, an etch back process), such that epitaxial source/drain features 40A, 40B are grown from recessed fins of IC device 10. In some implementations, epitaxial source/drain features 40A, 40B wrap the source/drain regions of fins of IC device 10, such as fin 20A. In such implementations, the fins may not be subjected to a fin recess process. In some implementations, epitaxial source/drain features 40A, 40B extend (grow) laterally along the y-direction (in some implementations, substantially perpendicular to the fins), such that epitaxial source/drain features 40A, 40B are merged epitaxial source/drain features that span more than one fin. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12 and/or the fins. Epitaxial source/drain features 40A, 40B are doped with n-type dopants and/or p-type dopants. In IC device 10, the PFET and the NFET have oppositely doped epitaxial source/drain features. For example, for the PFET, epitaxial source/drain features 40A are epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In furtherance of the example, for the NFET, epitaxial source/drain features 40B are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). It is noted that, in FIG. 1A, epitaxial source/drain features 40A, 40B are depicted as oxide definition (OD) regions, such that epitaxial source/drain features 40A, 40B can alternatively be referred to as OD regions. In some implementations, epitaxial source/drain features 40A, 40B include materials and/or dopants that achieve desired tensile stress and/or compressive stress in the channel regions. In some implementations, epitaxial source/drain features 40A, 40B are doped during deposition by adding impurities to a source material of the epitaxy process. In some implementations, epitaxial source/drain features 40A, 40B are doped by an ion implantation process subsequent to a deposition process. In some implementations, annealing processes are performed to activate dopants in epitaxial source/drain features 40A, 40B and/or other source/drain regions of IC device 10, such as HDD regions and/or LDD regions.

A multilayer interconnect (MLI) feature 50 is disposed over substrate 12. MLI feature 50 electrically couples various devices (for example, transistors, resistors, capacitors, and/or inductors) and/or components (for example, gate structures and/or source/drain features) of IC device 10, such that the various devices and/or components can operate as specified by design requirements of IC device 10. MLI feature 50 includes a combination of dielectric layers and electrically conductive layers (for example, metal layers) configured to form various interconnect structures that route signals between devices and/or components of IC device 10 and/or distributes signals (for example, clock signals, voltage signals, and/or ground signals) to the devices and/or the components of IC device 10 during operation. In some implementations, MLI feature 50 electrically couples one or more of gate structure 30A-30E, epitaxial source/drain feature 40A, and/or epitaxial source/drain features 40B to a power supply voltage, such as a positive supply voltage, a negative supply voltage, and/or ground. The conductive layers are configured to form interconnect routing layers, contact layers, and/or via layers, each of which can be disposed in different planes of MLI feature 50. In some implementations, via layers connect interconnect routing layers to one another, contact layers to interconnect routing layers, and/or device layers to interconnect routing layers. In some implementations, contact layers connect device layers to via layers and/or interconnect routing layers. It is noted that though MLI feature 50 is depicted with a given number of dielectric layers, conductive layers, interconnect routing layers, via layers, contact layers, levels, and/or planes, the present disclosure contemplates MLI feature 50 having more or less dielectric layers, conductive layers, interconnect routing layers, via layers, contact layers, levels, and/or planes.

MLI feature 50 includes one or more interlayer dielectric layers (ILDs) (also referred to as intermetal dielectric layers (IMDs)) sequentially stacked over substrate 12, such as an ILD layer 52 (ILD-0) disposed over substrate 12, an ILD layer 54 (ILD-1) disposed over ILD layer 52, an ILD layer 56 (ILD-2) disposed over ILD layer 54, an ILD layer 58 (ILD-3) disposed over ILD layer 56, an ILD layer 60 (ILD-4) disposed over ILD layer 58, an ILD layer 62 (ILD-5) disposed over ILD layer 64, an ILD layer 66 (ILD-6) disposed over ILD layer 64, and an ILD layer 68 (ILD-7) disposed over ILD layer 66. ILD layers 52-68 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK® (Dow Chemical, Midland, Michigan), polyimide, other low-k dielectric material, or combinations thereof. In the depicted embodiment, ILD layers 52-68 are dielectric layers that include a low-k dielectric material (generally referred to as low-k dielectric layers). In some implementations, low-k dielectric material generally refers to materials having a dielectric constant that is less than 3. In some implementations, ILD layers 52-68 can include a multilayer structure having multiple dielectric materials. In some implementations, MLI feature 50 can further include one or more contact etch stop layers (CESLs) disposed between ILD layers 52-68, such as a CESL disposed between ILD layer 52 and ILD layer 54, a CESL disposed between ILD layer 54 and ILD layer 56, a CESL disposed between ILD layer 56 and ILD layer 58, a CESL disposed between ILD layer 58 and ILD layer 60, a CESL disposed between ILD layer 60 and ILD layer 62, a CESL disposed between ILD layer 62 and ILD layer 64, a CESL disposed between ILD layer 64 and ILD layer 66, and a CESL disposed between ILD layer 66 and ILD layer 68. In some implementations, a CESL is disposed between ILD layer 52 and substrate 12, isolation feature 22, and/or fins. CESLs include a material different than ILD layers 52-68, such as a dielectric material that is different than the dielectric material of ILD layers 52-68. For example, where ILD layers 52-68 include a low-k dielectric material, CESLs include silicon and nitrogen, such as silicon nitride or silicon oxynitride. ILD layers 52-68 are formed over substrate 12 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 52-68 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 52-68, a CMP process and/or other planarization process is performed, such that ILD layers 52-68 have substantially planar surfaces.

Interconnect routing layers are sequentially stacked and disposed in ILD layers 52-68. In the depicted embodiment, MLI feature 50 includes an interconnect routing layer 70 (referred to as a metal one (M1) layer), an interconnect routing layer 75 (referred to as a metal two (M2) layer), an interconnect routing layer 80 (referred to as a metal three (M3) layer), an interconnect routing layer 85 (referred to as a metal four (M4) layer), an interconnect routing layer 90 (referred to as a metal five (M5) layer), an interconnect routing layer 95 (referred to as a metal six (M6) layer), and an interconnect routing layer 100 (referred to as a metal six (M7) layer). M1 layer, M3 layer, M5 layer, and M7 layer are collectively referred to as odd-numbered interconnect routing layers. Odd-numbered interconnect routing layers (here, interconnect routing layers 70, 80, 90, 100) include one or more electrically conductive lines that extend along the x-direction (for example, substantially perpendicular to gate structures 30A-30E), such that the electrically conductive lines of odd-numbered interconnect routing layers have a length defined in the x-direction, a width defined in the y-direction, and a height defined in the z-direction. For example, M1 layer includes a metal line 70A, M3 layer includes a metal line 80A and a metal line 80B, M5 layer includes a metal line 90A, and M7 layer includes a metal line 100A and a metal line 100B. Metal line 70A, metal lines 80A, 80B, metal line 90A, and metal lines 100A, 100B extend substantially along the x-direction (or horizontally), such that a routing direction of M1 layer, M3 layer, M5 layer, and M7 layer is substantially perpendicular to a direction along which gate structures 30A-30E extend. The odd-numbered interconnect routing layers (here, configured as horizontal routing layers) thus include unidirectional electrically conductive lines that have a length-wise direction that is substantially perpendicular (or orthogonal) to a gate length-wise direction. M2 layer, M4 layer, and M6 layer are collectively referred to as even-numbered interconnect routing layers. Even-numbered interconnect routing layers (here, interconnect routing layers 75, 85, 95) include one or more electrically conductive lines that extend along the y-direction (for example, substantially parallel to gate structures 30A-30E), such that the electrically conductive lines of even-numbered interconnect routing layers have a length defined in the y-direction, a width defined in the x-direction, and a height defined in the z-direction. For example, M2 layer includes a metal line 75A, a metal line 75B, a metal line 75C, a metal line 75D, a metal line 75E, a metal line 75F, and a metal line 75G; M4 layer includes a metal line 85A, a metal line 85B, a metal line 85C, a metal line 85D, a metal line 85E, and a metal line 85F; and M6 layer includes a metal line 95A, a metal line 95B, a metal line 95C, and a metal line 95D. Metal lines 75A-75F, metal lines 85A-85F, and metal lines 95A-95D extend substantially along the y-direction (or vertically), such that a routing direction of M2 layer, M4 layer, and M6 layer is substantially parallel to a direction along which gate structures 30A-30E extend. The even-numbered interconnect routing layers (here, configured as vertical routing layers) thus include unidirectional electrically conductive lines that have a length-wise direction that is substantially parallel to a gate length-wise direction.

In furtherance of the depicted embodiment, a gate pitch and a routing pitch of the even-numbered interconnect routing layers is configured to allow IC device 10 to meet high density, high routing efficiency, and high performance demands of ever-shrinking IC technology nodes. For purposes of the present disclosure, pitch (P) generally refers to a center-to-center distance between the same type of adjacent IC features, such as gate structures 30A-30E or electrically conductive lines (metal lines) of interconnect routing layers 70-100. In the depicted embodiment, a gate pitch (PG) is a center-to-center distance between adjacent gate structures 30A-30E (in particular, between gate electrodes 34), an M2 layer pitch (P2) is a center-to-center distance between adjacent metal lines 75A-75G of M2 layer (a first vertical routing layer of MLI feature 50), an M4 layer pitch is a center-to-center distance between adjacent metal lines 85A-85F of M4 layer (a second vertical routing layer of MLI feature 50), and an M6 layer pitch (P6) is a center-to-center distance between adjacent metal lines 95A-95D of M6 layer (a third vertical routing layer of MLI feature 50). The present disclosure ties PG to P2 and P6 to maximize logic density. For example, a ratio of PG to P2 and P6 (PG:P2:P6) is 3:2:4. In such implementations, P2 is less than PG and P6, and PG is less than P6. In some implementations, P4 is greater than P2 (P2<P4). In some implementations, P4 is less than P6 (P4<P6). In some implementations, PG is a minimum gate pitch, P2 is a minimum M2 layer pitch, P4 is a minimum M4 layer pitch, and P6 is a minimum M6 layer pitch. Minimum gate pitch generally refers to a smallest pitch achievable between gate structures (or gate electrodes) by processes and/or process equipment (generally referred to as processing) for a given IC technology node, minimum M2 layer pitch generally refers to a smallest pitch achievable between M2 conductive lines by processing for the given technology node, minimum M4 layer pitch generally refers to a smallest pitch achievable between M4 conductive lines by processing for the given technology node, and minimum M6 layer pitch generally refers to a smallest pitch achievable between M6 conductive lines by processing for the given technology node. It is noted that IC devices on the same IC chip or wafer as IC device 10 may include gate structures, M2 layers, M4 layers, and M6 layers having pitches equal to or greater than respective minimum gate pitch, minimum M2 layer pitch, minimum M4 layer pitch, and minimum M6 layer pitch, but cannot have pitches smaller than respective minimum gate pitch, minimum M2 layer pitch, minimum M4 layer pitch, and minimum M6 layer pitch. Fixing a ratio of PG to pitches of the even-numbered interconnect routing layers (for example, minimum gate pitch to even-numbered minimum routing pitches) in such manner maximizes routing density and/or cell packing density while maintaining IC performance and/or routing efficiency. IC device 10 thus meets both high density and high performance demands for advanced technology nodes. Furthermore, implementing unidirectional routing layers (both even and odd) increases IC processing yield. Different embodiments may have different advantages, and no particular advantage is necessarily required of any embodiment.

MLI feature 50 further includes a contact layer 110 disposed in ILD layer 52, which includes device-level contacts (also referred to as local interconnects or local contacts) that electrically couple and/or physically couple features of IC device 10 to a via layer 120 of MLI feature 50. For example, a device-level contact 110A and a device-level contact 110B are disposed on respective epitaxial source/drain features 40A, such that device-level contacts 110A, 110B physically (or directly) connect the source/drain regions of the PFET respectively to a via 120A and a via 120B of via layer 120. Device-level contacts 110A, 110B can be referred to as metal-to-device (MD) contacts, which generally refer to contacts to a conductive region, such as source/drain regions, of IC device 10. In some implementations, contact layer 110 includes one or more dummy contacts, which do not physically and/or electrically connect IC features to conductive features of MLI feature 50. In some implementations, dummy contacts have physical properties similar to device-level contacts 110A, 110B to enable a substantially uniform processing environment. Device-level contacts 110A, 110B extend through ILD layer 52 and/or ILD layer 54, though the present disclosure contemplates embodiments where device-level contacts 110A, 110B extend through more or less ILD layers and/or CESLs.

MLI feature 50 further includes via layer 120, a via layer 125, a via layer 130, a via layer 135, a via layer 140, a via layer 145, and a via layer 150 disposed in ILD layers 52-68. Via layers 120 electrically couples and/or physically couples contact layer 110 to interconnect routing layer 70; and via layers 125-150 electrically couple and/or physically couple interconnect routing layers 70-100 of MLI feature 50 to one another. In the depicted embodiment, via layer 120 includes via 120A and via 120B respectively disposed on device-level contact 110A and device-level contact 110B, such that via 120A and via 120B physically (or directly) connects respectively device-level contact 110A and device-level contact 110B to metal line 70A; via layer 125 includes vias disposed on metal line 70A, such that the vias physically (or directly) connect metal line 70A to interconnect routing layer 75 (for example, metal lines 75B, 75C, 75E, and 75F); via layer 130 includes vias disposed on interconnect routing layer 75 (for example, metal lines 75C, 75E), such that the vias physically (or directly) connect interconnect routing layer 75 to interconnect routing layer 80 (for example, metal lines 80A, 80B); via layer 135 includes vias disposed on interconnect routing layer 80 (for example, metal lines 80A, 80B), such that the vias physically (or directly) connect interconnect routing layer 80 to interconnect routing layer 85 (for example, metal lines 85B, 85C, 85D, 85E); via layer 140 includes vias disposed on interconnect routing layer 85 (for example, metal lines 85B, 85C, 85D, 85E), such that the vias physically (or directly) connect interconnect routing layer 85 to interconnect routing layer 90 (for example, metal line 90A); via layer 145 includes vias disposed on interconnect routing layer 90 (for example, metal line 90A), such that the vias physically (or directly) connect interconnect routing layer 90 to interconnect routing layer 95 (for example, metal lines 95B, 95C); and via layer 150 includes vias disposed on interconnect routing layer 90 (for example, metal lines 95B, 95C), such that the vias physically (or directly) connect interconnect routing layer 95 to interconnect routing layer 100 (for example, metal lines 100A, 100B). Via layer 125 further includes a via 120C electrically couples and/or physically couples an IC device feature (here, gate structure 30C) to interconnect routing layer 70. In such implementations, via 120C is physically and electrically coupled with gate structure 30C (in particular, gate electrode 34). In alternative implementations, MLI feature 50 further includes a device-level contact that electrically couples and/or physically couples gate structure 30C to via 120C. For example, the device-level contact is disposed on gate structure 30C, such that the device-level contact physically (or directly) connects gate structure 30C to via 120C, and via 120C physically (or directly) connects the device-level contact to conductive line 70A. Such device-level contact is thus referred to as a gate contact (CG) or metal-to-poly (MP) contact, which generally refers to a contact to a gate structure, such as a poly gate structure or a metal gate structure. Via layers 120-150 extend through one or more of ILD layers 52-68 as depicted, though the present disclosure contemplates embodiments where via layers 120-150 extend through more or less ILD layers and/or CESLs. In some implementations, MLI feature 50 further includes vias that interconnect routing layer 100 to interconnect layers disposed in other ILD layers (such as a metal eight (M8) layer of MLI feature 50, not shown) overlying ILD layers 52-68, thereby electrically and/or physically coupling M7 layer to M8 layer.

Interconnect routing layers 70-100, contact layer 110, and via layers 120-150 include any suitable electrically conductive material, such as Ta, Ti, Al, Cu, Co, W, TiN, TaN, other suitable conductive materials, or combinations thereof. Various conductive materials can be combined to provide the conductive features of interconnect routing layers 70-100, contact layer 110, and via layers 120-150 with various layers, such as a barrier layer, an adhesion layer, a liner layer, a bulk layer, other suitable layer, or combinations thereof. In some implementations, conductive lines of interconnect routing layers 70-100 include Cu, Co, and/or Ru; contacts of contact layer 110 include Ti, TiN, and/or Co; and vias of via layers 120-150 include Ti, TiN, and/or W. Interconnect routing layers 70-100, contact layer 110, and via layers 120-150 are formed by patterning ILD layers 52-68. Patterning ILD layers 52-68 can include lithography processes and/or etching processes to form openings (trenches), such as contact openings, via openings, and/or line openings in respective ILD layers 52-68. In some implementations, the lithography processes include forming a resist layer over respective ILD layers 52-68, exposing the resist layer to patterned radiation, and developing the exposed resist layer, thereby forming a patterned resist layer that can be used as a masking element for etching opening(s) in respective ILD layers 52-68. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 52-68, interconnect routing layers 70-100, contact layer 110, and/or via layers 120-150.

Figure 2A:
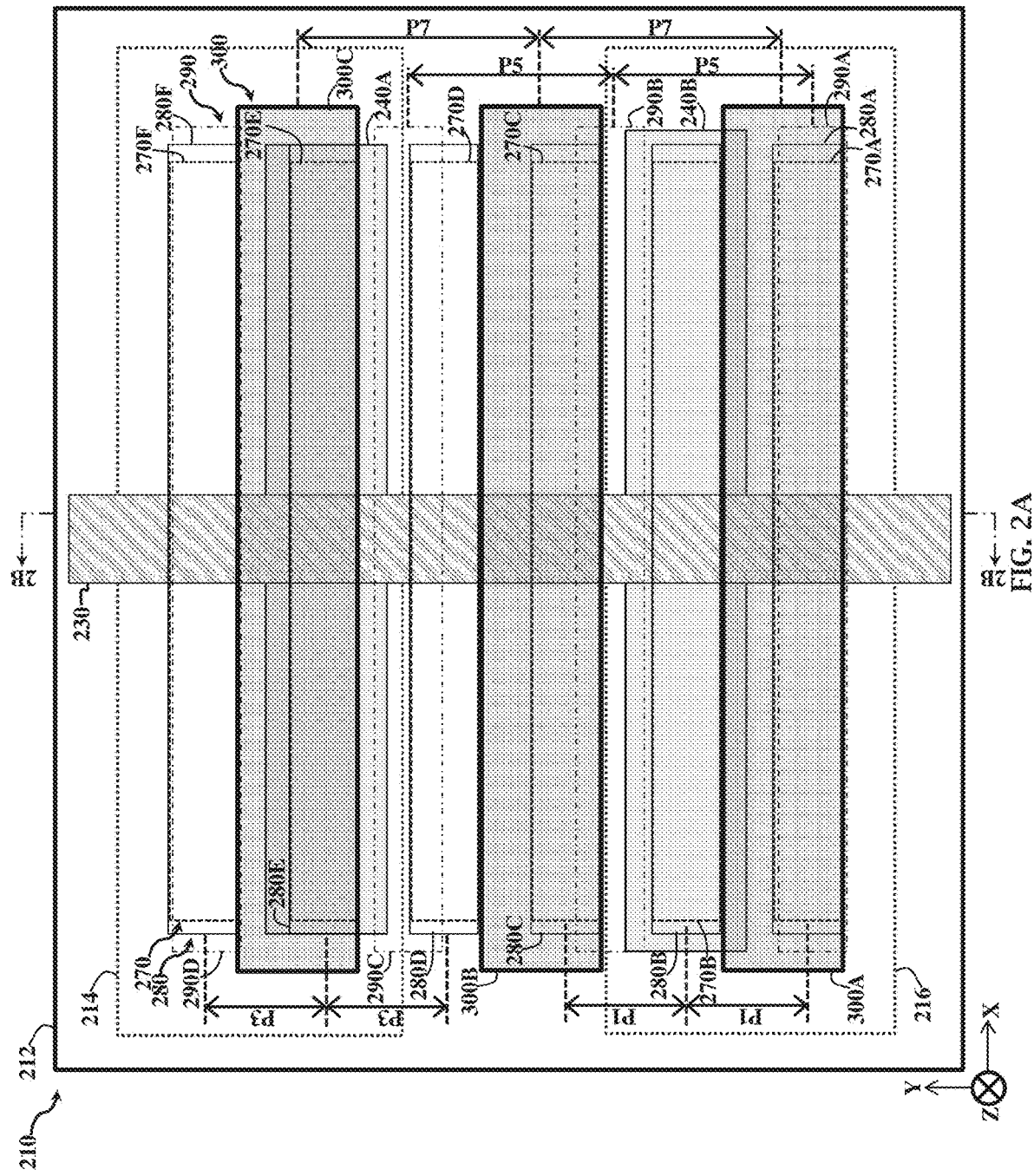
FIG. 2A is a simplified schematic top view of another integrated circuit device, in portion or entirety, having an interconnect structure that maximizes logic density according to various aspects of the present disclosure.
Figure 2B:
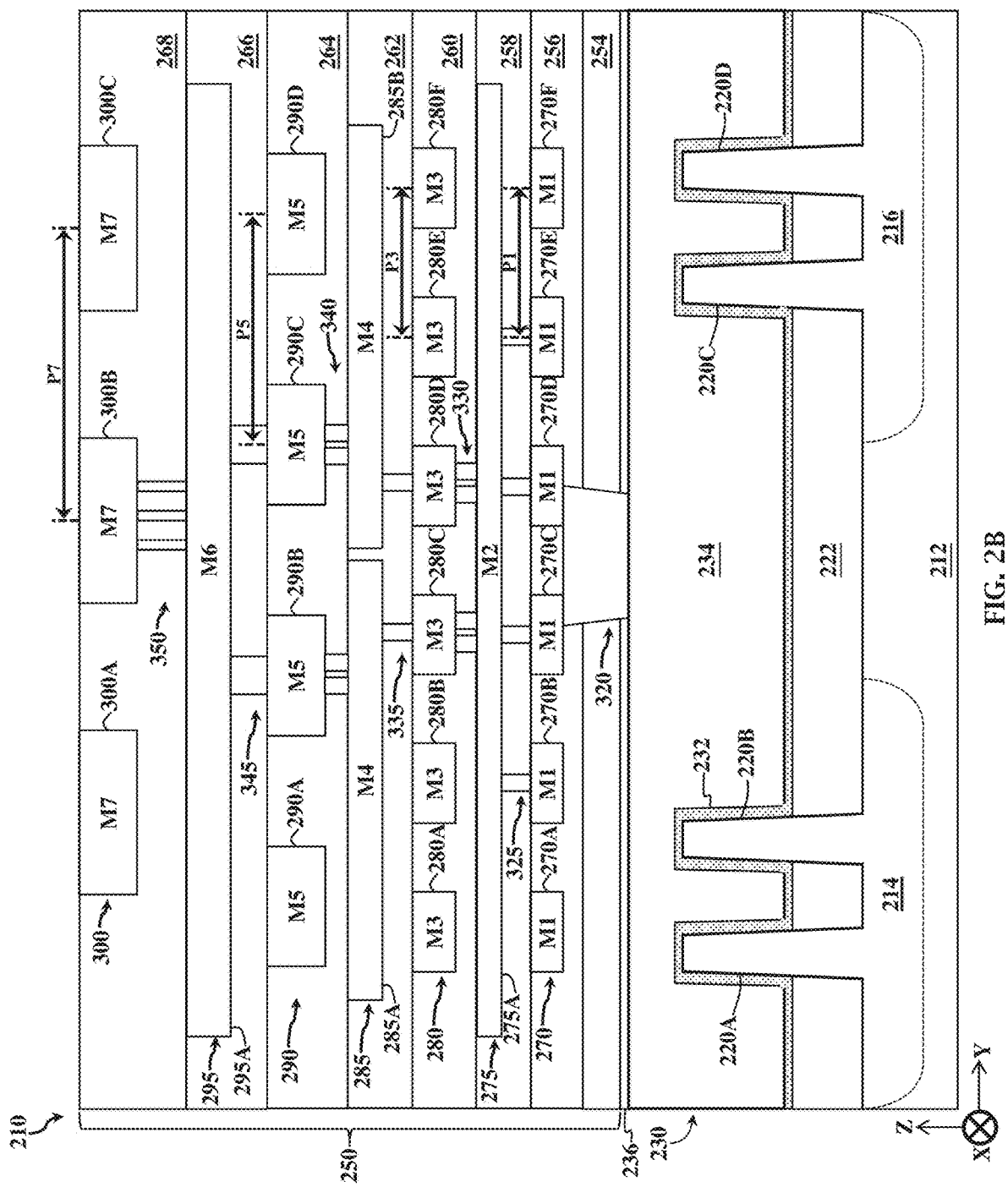
FIG. 2B is a diagrammatic cross-sectional view of the integrated circuit device of FIG. 2A along line 2B-2B according to various aspects of the present disclosure.

FIG. 2A and FIG. 2B are fragmentary diagrammatic views of an IC device 210, in portion or entirety, according to various aspects of the present disclosure. In particular, FIG. 2A is a simplified schematic top view of IC device 210 (for example, in an x-y plane), and FIG. 2B is a diagrammatic cross-sectional view of IC device 210 along line 2B-2B of FIG. 2A (for example, in a y-z plane). IC device 210 can be included in a microprocessor, a memory cell, and/or other IC device. In some implementations, IC device 210 is a portion of an IC chip, a SoC, or portion thereof, that includes various passive and active microelectronic devices, such as resistors, capacitors, inductors, diodes, PFETs, NFETs, MOSFETs, CMOS transistors, BJTs, LDMOS transistors, FinFETs, high voltage transistors, high frequency transistors, other suitable components, or combinations thereof. In some implementations, IC device 210 is a portion of a standard cell of an IC chip that performs a logic function (for example, AND, NAND, OR, NOR, NOT, XOR, and/or XNOR) and/or a storage function (for example, flip flop and/or latch). The standard cell can alternatively be referred to as a logic cell and/or a storage cell depending on its functionality. For purposes of the present disclosure, IC device 210 is a portion of a logic circuit that can be included in a logic cell. FIG. 2A and FIG. 2B have been simplified for the sake of clarity to better understand the inventive concepts of the present disclosure. Additional features can be added in IC device 210, and some of the features described below can be replaced, modified, or eliminated in other embodiments of IC device 210.

IC device 210 is similar in many respects to IC device 10. For example, IC device 210 includes a substrate 212 similar to substrate 12, a doped region 214 similar to doped region 14, a doped region 216 similar to doped region 16, one or more fins disposed over substrate 212 (here, a fin 220A, a fin 220B, a fin 220C, and a fin 220D similar to fin 20A), and a gate structure 230 (including a gate dielectric 232, a gate electrode 234, a gate hard mask (not shown), and gate spacers (not shown)) similar to gate structures 30A-30E (including gate dielectric 32, gate electrode 34, gate hard mask 36, and gate spacers 38), all of which are described above. IC device 210 further includes an MLI feature 250 that is similar to MLI feature 50 described above. For example, MLI feature 250 includes one or more ILDs, such as an ILD layer (ILD-0) (not shown in FIG. 2A and FIG. 2B) disposed over substrate 212, an ILD layer 254 (ILD-1) disposed over ILD-0, an ILD layer 256 (ILD-2) disposed over ILD layer 254, an ILD layer 258 (ILD-3) disposed over ILD layer 256, an ILD layer 260 (ILD-4) disposed over ILD layer 258, an ILD layer 262 (ILD-5) disposed over ILD layer 264, an ILD layer 266 (ILD-6) disposed over ILD layer 264, and an ILD layer 268 (ILD-7) disposed over ILD layer 266. ILD layers 254-268 are similar to ILD layers 52-68. In some implementations, MLI feature 250 can further include one or more CESLs disposed between ILD layers 254-268, which are configured similar to the CESLs described with reference to MLI feature 50.

MLI feature 250 further includes interconnect routing layers disposed in ILD layers 254-268. Interconnect routing layers of MLI feature 250 are configured differently than interconnect routing layers of MLI feature 50, yet such configuration also achieves the advantages described herein. In the depicted embodiment, MLI feature 250 includes an interconnect routing layer 270 (referred to as an M1 layer), an interconnect routing layer 275 (referred to as an M2 layer), an interconnect routing layer 280 (referred to as an M3 layer), an interconnect routing layer 285 (referred to as an M4 layer), an interconnect routing layer 290 (referred to as an M5 layer), an interconnect routing layer 295 (referred to as an M6 layer), and an interconnect routing layer 300 (referred to as an M7 layer). M1 layer, M3 layer, M5 layer, and M7 layer are collectively referred to as odd-numbered interconnect routing layers. Odd-numbered interconnect routing layers (here, interconnect routing layers 270, 280, 290, 300) include one or more electrically conductive lines that extend along the x-direction (for example, substantially perpendicular to gate structure 230), such that the electrically conductive lines of odd-numbered interconnect routing layers have a length defined in the x-direction, a width defined in the y-direction, and a height defined in the z-direction. For example, M1 layer includes a metal line 270A, a metal line 270B, a metal line 270C, a metal line 270D, a metal line 270E, and a metal line 270F; M3 layer includes a metal line 280A, a metal line 280B, a metal line 280C, a metal line 280D, a metal line 280E, and a metal line 280F; M5 layer includes a metal line 290A, a metal line 290B, a metal line 290C, and a metal line 290D; and M7 layer includes a metal line 300A, a metal line 300B, and a metal line 300C. Metal lines 270A-270F, metal lines 280A-280F, metal lines 290A-290D, and metal lines 300A-300C extend substantially along the x-direction (or horizontally), such that a routing direction of M1 layer, M3 layer, M5 layer, and M7 layer is substantially perpendicular to a direction along which gate structure 230 extends. The odd-numbered interconnect routing layers (here, configured as horizontal routing layers) thus include unidirectional electrically conductive lines that have a length-wise direction that is substantially perpendicular (or orthogonal) to a gate length-wise direction. M2 layer, M4 layer, and M6 layer are collectively referred to as even-numbered interconnect routing layers. Even-numbered interconnect routing layers (here, interconnect routing layers 275, 285, 295) include one or more electrically conductive lines that extend along the y-direction (for example, substantially parallel to gate structure 230), such that the electrically conductive lines of even-numbered interconnect routing layers have a length defined in the y-direction, a width defined in the x-direction, and a height defined in the z-direction. For example, M2 layer includes a metal line 275A, M4 layer includes a metal line 285A and a metal line 285B, and M6 layer includes a metal line 295A. Metal line 275A, metal lines 285A, 285B, and metal line 295A extend substantially along the y-direction (or vertically), such that a routing direction of M2 layer, M4 layer, and M6 layer is substantially parallel to a direction along which gate structure 230 extends. The even-numbered interconnect routing layers (here, configured as vertical routing layers) thus include unidirectional electrically conductive lines that have a length-wise direction that is substantially parallel to a gate length-wise direction.

In the depicted embodiment, a routing pitch of the odd-numbered interconnect routing layers is configured to allow IC device 210 to meet high density, high routing efficiency, and high performance demands of ever-shrinking IC technology nodes. For example, an M1 layer pitch (P1) is a center-to-center distance between adjacent metal lines 270A-270F of M1 layer (a first horizontal routing layer of MLI feature 250), an M3 layer pitch (P3) is a center-to-center distance between adjacent metal lines 280A-280F of M3 layer (a second horizontal routing layer of MLI feature 250), an M5 layer pitch (P5) is a center-to-center distance between adjacent metal lines 290A-290D of M5 layer (a third horizontal routing layer of MLI feature 250); and an M7 layer pitch (P7) is a center-to-center distance between adjacent metal lines 300A-300C of M7 layer (a fourth horizontal routing layer of MLI feature 250). The present disclosure ties pitches of the odd-numbered interconnect routing layers, such as P1, P3, P5, and/or P7, to maximize logic density. For example, a ratio of P1 to P3 to P7 (P1:P3:P7) is 1:1:2. In such implementations, P1 is substantially equal to P3, and P7 is greater than P1 and P3. In some implementations, P5 is greater than P1 and P3 (P1, P3>P5). In some implementations, P5 is less than P7 (P5<P7). In some implementations, P1 is a minimum M1 layer pitch, P3 is a minimum M3 layer pitch, P5 is a minimum M5 layer pitch, and P7 is a minimum M7 layer pitch. Minimum M1 layer pitch generally refers to a smallest pitch achievable between M1 conductive lines by processes and/or process equipment (generally referred to as processing) for a given IC technology node, minimum M3 layer pitch generally refers to a smallest pitch achievable between M3 conductive lines by processing for the given technology node, minimum M5 layer pitch generally refers to a smallest pitch achievable between M5 conductive lines by processing for the given technology node, and minimum M7 layer pitch generally refers to a smallest pitch achievable between M7 conductive lines by processing for the given technology node. It is noted that IC devices on the same IC chip or wafer as IC device 10 may include M1 layers, M3 layers, M5 layers, and M7 layers having pitches equal to or greater than respective minimum M1 layer pitch, minimum M3 layer pitch, minimum M5 layer pitch, and minimum M7 layer pitch, but cannot have pitches smaller than respective minimum M1 layer pitch, minimum M3 layer pitch, minimum M5 layer pitch, and minimum M7 layer pitch. Fixing a ratio of the odd-numbered interconnect routing layers relative to one another (for example, minimum pitches) in such manner maximizes routing density and/or cell packing density while maintaining IC performance and/or routing efficiency. IC device 210 thus meets both high density and high performance demands for advanced technology nodes. Furthermore, implementing unidirectional routing layers increases IC processing yield. Different embodiments may have different advantages, and no particular advantage is necessarily required of any embodiment.

In furtherance of the depicted embodiment, similar to MLI feature 50, MLI feature 250 includes contact layers (not shown), a via layer 320, a via layer 325, a via layer 330, a via layer 335, a via layer 340, a via layer 345, and a via layer 350 disposed in ILD layers 254-268. Via layers 320 electrically couples and/or physically couples a device layer to interconnect routing layer 270. Via layers 325-350 electrically couple and/or physically couple interconnect routing layers 270-300 of MLI feature 250 to one another. In the depicted embodiment, via layer 220 includes a via respectively disposed on gate structure 230 (in particular, gate electrode 234), such that the via physically (or directly) connects gate structure 230 to metal lines 270C, metal line 270D; via layer 225 includes vias disposed on interconnect routing layer 270 (for example, metal lines 270B, 270C, 270D, and 270E), such that the vias physically (or directly) connect interconnect routing layer 270 to interconnect routing layer 275 (for example, metal line 275A); via layer 330 includes vias disposed on interconnect routing layer 275 (for example, metal line 275A), such that the vias physically (or directly) connect interconnect routing layer 275 to interconnect routing layer 280 (for example, metal lines 280C, 280D); via layer 335 includes vias disposed on interconnect routing layer 280 (for example, metal lines 280C, 280D), such that the vias physically (or directly) connect interconnect routing layer 280 to interconnect routing layer 285 (for example, metal lines 285A, 285B); via layer 340 includes vias disposed on interconnect routing layer 285 (for example, metal lines 285A, 285B), such that the vias physically (or directly) connect interconnect routing layer 285 to interconnect routing layer 290 (for example, metal lines 290B, 290C); via layer 345 includes vias disposed on interconnect routing layer 290 (for example, metal lines 290B, 290C), such that the vias physically (or directly) connect interconnect routing layer 290 to interconnect routing layer 295 (for example, metal line 295A); and via layer 350 includes vias disposed on interconnect routing layer 290 (for example, metal line 295A), such that the vias physically (or directly) connect interconnect routing layer 295 to interconnect routing layer 300 (for example, metal line 300B). In alternative implementations, MLI feature 250 further includes a device-level contact that electrically couples and/or physically couples gate structure 230 to the via of via layer 320. For example, the device-level contact is disposed on gate structure 230, such that the device-level contact physically (or directly) connects gate structure 230 to via layer 320. Via layers 320-350 extend through one or more of ILD layers 254-268 as depicted, though the present disclosure contemplates embodiments where via layers 320-350 extend through more or less ILD layers and/or CESLs. In some implementations, MLI feature 250 further includes vias that interconnect routing layer 300 to interconnect layers disposed in other ILD layers (such as a metal eight (M8) layer of MLI feature 250, not shown) overlying ILD layers 254-268, thereby electrically and/or physically coupling M7 layer to M8 layer.

Interconnect routing layers 270-300 and via layers 320-350 include any suitable electrically conductive material, such as Ta, Ti, Al, Cu, Co, W, TiN, TaN, other suitable conductive materials, or combinations thereof. Various conductive materials can be combined to provide the conductive features of interconnect routing layers 270-300 and via layers 320-350 with various layers, such as a barrier layer, an adhesion layer, a liner layer, a bulk layer, other suitable layer, or combinations thereof. In some implementations, conductive lines of interconnect routing layers 270-300 include Cu, Co, and/or Ru; contacts of a contact layer include Ti, TiN, and/or Co; and vias of via layers 320-350 include Ti, TiN, and/or W. Interconnect routing layers 270-300 and via layers 320-350 are formed by patterning ILD layers 254-268. Patterning ILD layers 254-268 can include lithography processes and/or etching processes to form openings (trenches), such as contact openings, via openings, and/or line openings in respective ILD layers 254-268. In some implementations, the lithography processes include forming a resist layer over respective ILD layers 254-268, exposing the resist layer to patterned radiation, and developing the exposed resist layer, thereby forming a patterned resist layer that can be used as a masking element for etching opening(s) in respective ILD layers 254-268. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 254-268, interconnect routing layers 270-300 and/or via layers 320-350.

Figure 3:
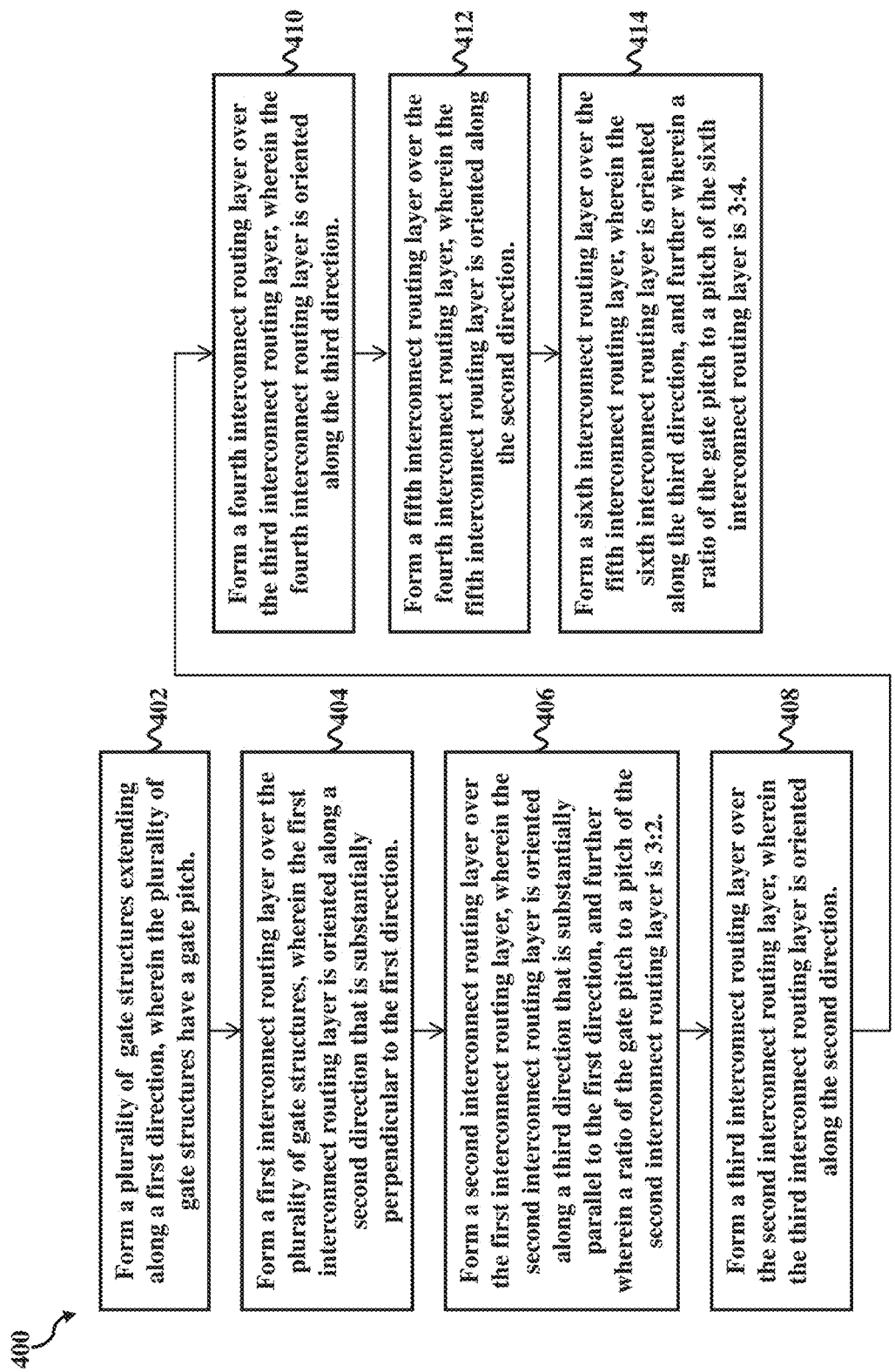
FIG. 3 is a flow chart of a method for fabricating an interconnect structure for an integrated circuit device, such as depicted in FIG. 1A and FIG. 1B, according to various aspects of the present disclosure.

FIG. 3 is a flow chart of a method 400 for fabricating an interconnect structure for an integrated circuit device, such as MLI feature 50 of IC device 10, according to various aspects of the present disclosure. At block 402, method 400 includes forming a plurality of gate structures extending along a first direction. The plurality of gate structures has a gate pitch. At block 404, a first interconnect routing layer is formed over the plurality of gate structures. The first interconnect routing layer is oriented along a second direction that is substantially perpendicular to the first direction. At block 406, a second interconnect routing layer is formed over the first interconnect routing layer. The second interconnect routing layer is oriented along a third direction that is substantially parallel to the first direction. A ratio of the gate pitch to a pitch of the second interconnect routing layer is 3:2. At block 408, a third interconnect routing layer is formed over the second interconnect routing layer. The third interconnect routing layer is oriented along the second direction. At block 410, a fourth interconnect routing layer is formed over the third interconnect routing layer. The fourth interconnect routing layer is oriented along the third direction. At block 412, a fifth interconnect routing layer is formed over the fourth interconnect routing layer. The fifth interconnect routing layer is oriented along the second direction. At block 414, a sixth interconnect routing layer is formed over the fifth interconnect routing layer. The sixth interconnect routing layer is oriented along the third direction. A ratio of the gate pitch to a pitch of the sixth interconnect routing layer is 3:4. Accordingly, a ratio of the gate pitch to a pitch of the second interconnect routing layer to the sixth interconnect routing layer is 3:2:4. In some implementations, forming each of the first interconnect routing layer, the second interconnect routing layer, the third interconnect routing layer, the fourth interconnect routing layer, the fifth interconnect routing layer, and the sixth interconnect routing layer includes forming a dielectric layer over a substrate, forming a plurality of openings in the dielectric layer, and filling the plurality of openings with a conductive material. The openings can be configured to achieve desired pitches of each of the first interconnect routing layer, the second interconnect routing layer, the third interconnect routing layer, the fourth interconnect routing layer, the fifth interconnect routing layer, and the sixth interconnect routing layer. Additional steps can be provided before, during, and after method 400, and some of the steps described can be moved, replaced, or eliminated for additional embodiments of method 400.

FIG. 4 is a flow chart of a method 500 for fabricating an interconnect structure for an integrated circuit device, such as MLI feature 250 of IC device 210, according to various aspects of the present disclosure. At block 502, method 400 includes forming a gate structure extending along a first direction. At block 504, a first interconnect routing layer is formed over the gate structure. The first interconnect routing layer is oriented along a second direction that is substantially perpendicular to the first direction. At block 506, a second interconnect routing layer is formed over the first interconnect routing layer. The second interconnect routing layer is oriented along a third direction that is substantially parallel to the first direction. At block 508, a third interconnect routing layer is formed over the second interconnect routing layer. The third interconnect routing layer is oriented along the second direction. A ratio of a pitch of the first interconnect routing layer to a pitch of the third interconnect routing layer is 1:1. At block 510, a fourth interconnect routing layer is formed over the third interconnect routing layer. The fourth interconnect routing layer is oriented along the third direction. At block 512, a fifth interconnect routing layer is formed over the fourth interconnect routing layer. The fifth interconnect routing layer is oriented along the second direction. At block 514, a sixth interconnect routing layer is formed over the fifth interconnect routing layer. The sixth interconnect routing layer is oriented along the third direction. At block 516, a seventh interconnect routing layer is formed over the sixth interconnect routing layer. The seventh interconnect routing layer is oriented along the second direction. A ratio of a pitch of the first interconnect routing layer to a pitch of the seventh interconnect routing layer is 1:2. Accordingly, a ratio of a pitch of the first interconnect routing layer to a pitch of the third interconnect routing layer to the seventh interconnect routing layer is 1:1:2. In some implementations, forming each of the first interconnect routing layer, the second interconnect routing layer, the third interconnect routing layer, the fourth interconnect routing layer, the fifth interconnect routing layer, the sixth interconnect routing layer, and the seventh interconnect routing layer includes forming a dielectric layer over a substrate, forming a plurality of openings in the dielectric layer, and filling the plurality of openings with a conductive material. The openings can be configured to achieve desired pitches of each of the first interconnect routing layer, the second interconnect routing layer, the third interconnect routing layer, the fourth interconnect routing layer, the fifth interconnect routing layer, the sixth interconnect routing layer, and the seventh interconnect routing layer. Additional steps can be provided before, during, and after method 500, and some of the steps described can be moved, replaced, or eliminated for additional embodiments of method 500.

The present disclosure provides for many different embodiments. Interconnect structures for integrated circuit devices that maximize IC density and corresponding formation techniques are disclosed herein. In the depicted embodiments, the interconnect structures are implemented in Fin-FETs. However, the present disclosure contemplates the interconnect structures being implemented in any of a variety of device types. For example, aspects of the present disclosure may be implemented to form interconnect structures as described herein for planar field-effect transistors (FETs), multi-gate transistors (planar or vertical), such as FinFET devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other integrated circuit devices that can benefit from the interconnect structures described herein. Furthermore, the present disclosure contemplates combination of the interconnect structures described herein, such that an integrated circuit device can include an interconnect structure having pitch ratios described herein for both odd-numbered interconnect routing layers and even-numbered interconnect routing layers. In some implementations, an interconnect structure can fix a pitch of the even-numbered interconnect routing layers to a gate pitch and fix a pitch of the odd-numbered interconnect routing layers to one another. For example, in the interconnect structure, a ratio of a gate pitch to a pitch of a first of the even-numbered interconnect routing layers to a pitch of a third of the even-numbered interconnect routing layers is 3:2:4, while a pitch of a first of the odd-numbered interconnect routing layers to a pitch of a third of the odd-numbered interconnect routing layers to a pitch of a seventh of the odd-numbered interconnect routing layers is 1:1:2.

An exemplary integrated circuit device includes a plurality of gate structures extending along a first direction and an interconnect structure disposed over the plurality of gate structures. The interconnect structure includes odd-numbered interconnect routing layers oriented along a second direction that is substantially perpendicular to the first direction and even-numbered interconnect routing layers oriented along a third direction that is substantially parallel to the first direction. The plurality of gate structures has a gate pitch (GP), a first of the even-numbered interconnect routing layers has a first pitch (P2), and a third of the even-numbered interconnect routing layers has a second pitch (P6). A ratio of the gate pitch to the first pitch to the second pitch (GP:P2:P6) is 3:2:4. In some implementations, a second of the even-numbered interconnect routing layers has a third pitch (P4) that is greater than the first pitch and less than the second pitch (P2<P4<P6). In some implementations, conductive lines of the odd-numbered interconnect routing layers have lengths extending only in the second direction. In some implementations, conductive lines of the even-numbered interconnect routing layers have lengths extending only in the third direction. In some implementations, the odd-numbered interconnect routing layers and the even-numbered interconnect routing layers are disposed in a dielectric material of the interconnect structure.

Another exemplary integrated circuit device includes a gate structure extending along a first direction and an interconnect structure disposed over the gate structure. The interconnect structure includes odd-numbered interconnect routing layers oriented along a second direction that is substantially perpendicular to the first direction and even-numbered interconnect routing layers oriented along a third direction that is substantially parallel to the first direction. A first of the odd-numbered interconnect routing layers has a first pitch (P1), a second of the odd-numbered interconnect routing layers has a second pitch (P3), and a fourth of the odd-numbered interconnect routing layer has a third pitch (P7). A ratio of the first pitch to the second pitch to the third pitch (P1:P3:P7) is 1:1:2. In some implementations, a third of the even-numbered interconnect routing layers has a fourth pitch (P5) that is greater than the first pitch and the second pitch and less than the third pitch (P1, P3<P5<P7). In some implementations, conductive lines of the odd-numbered interconnect routing layers have lengths extending only in the second direction. In some implementations, conductive lines of the even-numbered interconnect routing layers have lengths extending only in the third direction. In some implementations, the odd-numbered interconnect routing layers and the even-numbered interconnect routing layers are disposed in a dielectric material of the interconnect structure.

An exemplary interconnect structure includes a plurality of interlevel dielectric (ILD) layers disposed over a gate layer and a plurality of metal routing layers disposed in the ILD layers. The interconnect structure is electrically coupled to the gate layer. The plurality of metal routing layers include a first metal layer, a second metal layer, a third metal layer, a fourth metal layer, a fifth metal layer, a sixth metal layer, and a seventh metal layer sequentially disposed over the gate layer. The first metal layer, the third metal layer, the fifth metal layer, and the seventh metal layer each extend unidirectional along a first length-wise direction that is substantially perpendicular to a length-wise direction of the gate layer. The second metal layer, the fourth metal layer, and the sixth metal layer each extend unidirectional along a second length-wise direction that is substantially parallel to the length-wise direction of the gate layer. A ratio of a pitch of the gate layer (PG) to a pitch of the second metal layer (P2) to a pitch of the sixth metal layer (P6) is 3:2:4 (PG:P2:P6). In some implementations, a pitch of the fourth metal layer (P4) is greater the pitch of the second metal layer (P4>P2). In some implementations, a pitch of the fourth metal layer is less than the pitch of the sixth metal layer (P4<P6). In some implementations, a width of metal lines of the second metal layer is less than a width of metal lines of the sixth metal layer. In some implementations, gate electrode lines of the gate layer span over an n-type region of a p-type transistor and a p-type region of an n-type transistor.

Another exemplary interconnect structure includes a plurality of interlevel dielectric (ILD) layers disposed over a gate electrode and a plurality of metal routing layers disposed in the ILD layers. The interconnect structure is electrically coupled to the gate electrode. The plurality of metal routing layers include a first metal layer, a second metal layer, a third metal layer, a fourth metal layer, a fifth metal layer, a sixth metal layer, and a seventh metal layer sequentially disposed over the gate electrode. The first metal layer, the third metal layer, the fifth metal layer, and the seventh metal layer each extend unidirectional along a first length-wise direction that is substantially perpendicular to a length-wise direction of the gate electrode. The second metal layer, the fourth metal layer, and the sixth metal layer each extend unidirectional along a second length-wise direction that is substantially parallel to the length-wise direction of the gate electrode. A ratio of a pitch of the first metal layer (P1) to a pitch of the third metal layer (P3) to a pitch of the seventh metal layer (P7) is 1:1:2 (P1:P3:P7). In some implementations, a pitch of the fifth metal layer (P5) is greater the pitch of the first metal layer and the pitch of the third metal layer (P5>P1, P3). In some implementations, a pitch of the fifth metal layer is less than the pitch of the seventh metal layer (P5<P7). In some implementations, a width of metal lines of the first metal layer is less than a width of metal lines of the seventh metal layer. In some implementations, a width of metal lines of the third metal layer is less than a width of metal lines of the seventh metal layer.

An exemplary method for forming an interconnect structure for an integrated circuit device includes forming a plurality of gate structures extending along a first direction; forming a first interconnect routing layer over the plurality of gate structures; forming a second interconnect routing layer over the first interconnect routing layer; forming a third interconnect routing layer over the second interconnect routing layer; forming a fourth interconnect routing layer over the third interconnect routing layer; forming a fifth interconnect routing layer over the fourth interconnect routing layer; and forming a sixth interconnect routing layer over the fifth interconnect routing layer. The first interconnect routing layer, the third interconnect routing layer, and the fifth interconnect routing layer are oriented along a second direction that is substantially perpendicular to the first direction. The second interconnect routing layer, the fourth interconnect routing layer, and the sixth interconnect routing layer are oriented along a third direction that is substantially parallel to the first direction. The plurality of gate structures has a gate pitch (GP). A ratio of the gate pitch (GP) to a pitch of the second interconnect routing layer (P2) to a pitch of the sixth interconnect routing layer (P6) is 3:2:4 (PG:P2:P6). In some implementations, each of the first interconnect routing layer, the second interconnect routing layer, the third interconnect routing layer, the fourth interconnect routing layer, the fifth interconnect routing layer, and the sixth interconnect routing layer is fabricated by forming a dielectric layer over a substrate; forming a plurality of openings in the dielectric layer; and filling the plurality of openings with a conductive material.

Another exemplary method for forming an interconnect structure for an integrated circuit device includes forming a gate structure extending along a first direction; forming a first interconnect routing layer over the gate structure; forming a second interconnect routing layer over the first interconnect routing layer; forming a third interconnect routing layer over the second interconnect routing layer; forming a fourth interconnect routing layer over the third interconnect routing layer; forming a fifth interconnect routing layer over the fourth interconnect routing layer; forming a sixth interconnect routing layer over the fifth interconnect routing layer; and forming a seventh interconnect routing layer over the sixth interconnect routing layer. The first interconnect routing layer, the third interconnect routing layer, the fifth interconnect routing layer, and the seventh interconnect routing layer are oriented along a second direction that is substantially perpendicular to the first direction.

The second interconnect routing layer, the fourth interconnect routing layer, and the sixth interconnect routing layer are oriented along a third direction that is substantially parallel to the first direction. A ratio of a pitch of the first interconnect routing layer (P1) to a pitch of the third interconnect routing layer (P3) to a pitch of the seventh interconnect routing layer (P7) (P1:P3:P7) is 1:1:2. In some implementations, each of the first interconnect routing layer, the second interconnect routing layer, the third interconnect routing layer, the fourth interconnect routing layer, the fifth interconnect routing layer, the sixth interconnect routing layer, and the seventh interconnect routing layer is fabricated by forming a dielectric layer over a substrate; forming a plurality of openings in the dielectric layer; and filling the plurality of openings with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of gate electrodes extending along a first direction, wherein the plurality of gate electrodes has a gate pitch (GP), wherein at least one of the plurality of gate electrodes is disposed over and engages a respective channel region and the at least one of the plurality of gate electrodes is disposed between respective source/drain regions; and
    forming an interconnect structure over the plurality of gate electrodes, wherein the forming the interconnect structure includes:
        forming odd-numbered interconnect routing layers oriented along a second direction that is substantially perpendicular to the first direction,
        forming even-numbered interconnect routing layers oriented along a third direction that is substantially parallel to the first direction, wherein a first of the even-numbered interconnect routing layers has a first pitch (P2) and a third of the even-numbered interconnect routing layers has a second pitch (P6), and
        configuring the first pitch and the second pitch, such that a ratio of the gate pitch to the first pitch to the second pitch (GP:P2:P6) is 3:2:4.

2. The method of claim 1, wherein a second of the even-numbered interconnect routing layers has a third pitch (P4), wherein the third pitch is greater than the first pitch and less than the second pitch (P2<P4<P6).

3. The method of claim 1, wherein the forming the odd-numbered interconnect routing layers oriented along the second direction includes forming conductive lines having lengths that extend only in the second direction.

4. The method of claim 1, wherein the forming the even-numbered interconnect routing layers oriented along the third direction includes forming conductive lines having lengths that extend only in the third direction.

5. The method of claim 1, wherein the gate pitch is a minimum gate pitch, the first pitch is a minimum pitch of the first of the even-numbered interconnect routing layers, and the second pitch is a minimum pitch of the third of the even-numbered interconnect routing layers.

6. The method of claim 1, wherein the respective channel region is a channel region of a semiconductor fin.

7. The method of claim 1, wherein the forming the plurality of gate electrodes and the forming the interconnect structure includes forming a portion of a logic circuit.

8. The method of claim 1, further comprising forming a plurality of fins extending along the second direction before forming the plurality of gate electrodes, wherein the plurality of gate electrodes is disposed over and engage a portion of the plurality of fins.

9. A method for forming an interconnect structure comprising:
    forming a plurality of interlevel dielectric (ILD) layers over a gate layer, wherein the interconnect structure is electrically coupled to the gate layer and the gate layer includes a plurality of gate stacks extending along a first lengthwise direction;
    forming a plurality of metal routing layers in the plurality of ILD layers, wherein the plurality of metal routing layers includes a first metal layer, a second metal layer, a third metal layer, a fourth metal layer, a fifth metal layer, a sixth metal layer, and a seventh metal layer sequentially disposed over the gate layer;
    forming a plurality of via layers in the plurality of ILD layers, wherein the plurality of via layers includes a first via layer, a second via layer, a third via layer, a fourth via layer, a fifth via layer, a sixth via layer, and a seventh via layer sequentially disposed over the gate layer;
    forming a contact layer in the plurality of ILD layers; and
    wherein:
        the first via layer couples the gate layer to the first metal layer, the second via layer couples the first metal layer to the second metal layer, the third via layer couples the second metal layer to the third metal layer, the fourth via layer couples the third metal layer to the fourth metal layer, the fifth via layer couples the fourth metal layer to the fifth metal layer, the sixth via layer couples the fifth metal layer to the sixth metal layer, and the seventh via layer couples the sixth metal layer to the seventh metal layer,
        the first via layer further couples the contact layer to the first metal layer,
        the first metal layer, the third metal layer, the fifth metal layer, and the seventh metal layer each extend unidirectional along a second lengthwise direction that is substantially perpendicular to the first lengthwise direction,
        the second metal layer, the fourth metal layer, and the sixth metal layer each extend unidirectional along a third lengthwise direction that is substantially parallel to the first lengthwise direction, and
        a ratio of a pitch of the gate layer (PG) to a pitch of the second metal layer (P2) to a pitch of the sixth metal layer (P6) is 3:2:4 (PG:P2:P6).

10. The method of claim 9, wherein a pitch of the fourth metal layer (P4) is greater the pitch of the second metal layer (P2>P2).

11. The method of claim 9, wherein a pitch of the fourth metal layer is less than the pitch of the sixth metal layer (P4<P6).

12. The method of claim 9, wherein a width of metal lines of the second metal layer is less than a width of metal lines of the sixth metal layer.

13. The method of claim 9, wherein gate electrode lines of the gate layer span over an n-type region of a p-type transistor and a p-type region of an n-type transistor.

14. The method of claim 9, wherein at least some of the plurality of gate stacks include a gate electrode disposed over a gate dielectric.

15. The method of claim 9, wherein:
the plurality of metal routing layers includes Cu, Co, Ru, or combinations thereof;
the plurality of via layers includes Ti, TiN, W, or combinations thereof; and
the contact layer includes Ti, TiN, Co, or combinations thereof.

16. A method comprising:
forming a gate structure extending along a first direction; and
forming an interconnect structure over the gate structure, wherein the forming the interconnect structure includes:
forming odd-numbered interconnect routing layers oriented along a second direction that is substantially perpendicular to the first direction,
forming even-numbered interconnect routing layers oriented along a third direction that is substantially parallel to the first direction, wherein a first of the odd-numbered interconnect routing layers has a first pitch (P1), a second of the odd-numbered interconnect routing layers has a second pitch (P3), and a fourth of the odd-numbered interconnect routing layer has a third pitch (P7), and
configuring the first pitch, the second pitch, and the third pitch, such that a ratio of the first pitch to the second pitch to the third pitch (P1:P3:P7) is 1:1:2.

17. The method of claim 16, wherein a third of the even-numbered interconnect routing layers has a fourth pitch (P5), wherein the fourth pitch is greater than the first pitch and the second pitch and less than the third pitch (P1, P3<P5<P7).

18. The method of claim 16, wherein the forming the odd-numbered interconnect routing layers oriented along the second direction includes forming conductive lines having lengths that extend only in the second direction.

19. The method of claim 16, wherein the forming the even-numbered interconnect routing layers oriented along the third direction includes forming conductive lines having lengths extending only in the third direction.

20. The method of claim 16, wherein the first pitch is a minimum pitch of the first of the odd-numbered interconnect routing layers, the second pitch is a minimum pitch of the second of the odd-numbered interconnect routing layers, and the third pitch is a minimum pitch of the fourth of the odd-numbered interconnect routing layers.

* * * * *